United States Patent [19]
Ribner

[11] Patent Number: 5,181,032
[45] Date of Patent: * Jan. 19, 1993

[54] HIGH-ORDER, PLURAL-BIT-QUANTIZATION SIGMA-DELTA MODULATORS USING SINGLE-BIT DIGITAL-TO-ANALOG CONVERSION FEEDBACK

[75] Inventor: David B. Ribner, Schenectady, N.Y.

[73] Assignee: General Electric Company, Schenectady, N.Y.

[*] Notice: The portion of the term of this patent subsequent to Jan. 28, 2009 has been disclaimed.

[21] Appl. No.: 756,670

[22] Filed: Sep. 9, 1991

[51] Int. Cl.⁵ .......................................... H03M 3/04
[52] U.S. Cl. .................................... 341/143; 341/155
[58] Field of Search ............................... 341/143, 155

[56] References Cited

U.S. PATENT DOCUMENTS

| | | | |
|---|---|---|---|
| 4,186,384 | 1/1980 | Acker | 341/143 |
| 5,055,843 | 10/1991 | Ferguson, Jr. et al. | 341/143 |
| 5,084,702 | 1/1992 | Ribner | 341/143 |
| 5,101,205 | 3/1992 | Yasuda | 341/143 |

OTHER PUBLICATIONS

R. Schreir et al., Bandpass Sigma-Delta Modulation, Electronics Letters, vol. 25 No. 23 pp. 1560-1561, Nov. 1989.

Primary Examiner—Howard L. Williams
Attorney, Agent, or Firm—Marvin Snyder

[57] ABSTRACT

A high-order sigma-delta modulator has a single feedback loop including a linear network and a quantizer, which quantizer comprises a plural-bit analog-to-digital converter, a digital comparator and a single-bit digital-to-analog converter. The linear network comprises a cascade of integrators, a second-order resonator, a cascade of second-order resonators or a cascade of second-order resonators with an additional integrator. The loop behaves much the same as a conventional single-feedback-loop, one-bit sigma-delta modulator, inasfar as the feedback signal is concerned. However, a plural-bit preliminary output signal is available, so the truncation error can be determined. The truncation error is cancelled in the ultimate output signal from the high-order sigma-delta modulator, using additional digital circuitry having the a transfer function analogous to the overall transfer function for input signal of the cascade connection of the linear network, plural-bit analog-to-digital converter in the quantizer, and any scaling circuitry therein or thereafter.

14 Claims, 7 Drawing Sheets

HIGH-ORDER, PLURAL-BIT-QUANTIZATION SIGMA-DELTA MODULATORS USING SINGLE-BIT DIGITAL-TO-ANALOG CONVERSION FEEDBACK

The invention relates to sigma-delta modulators and, more particularly, to single-loop sigma-delta modulators of plural-order type.

BACKGROUND OF THE INVENTION

Sigma-delta modulators (sometimes referred to as delta-sigma modulators) have been used in analog-to-digital converters (ADCs) for some time. The reader is referred to the following technical articles incorporated herein by reference.
1) "A Use of Limit Cycle Oscillators to Obtain Robust Analog to Digital Converters", J. C. Candy, IEEE TRANSACTIONS ON COMMUNICATIONS, Vol. COM-22, No. 3, pp. 298-305, March, 1974.
2) "Using Triangularly Weighted Interpolation to Get 13-Bit PCM from a Sigma-Delta Modulator", J. C. Candy, et al., IEEE TRANSACTIONS ON COMMUNICATIONS, Vol. COM-24, No. 11, pp. 1268-1275, November, 1976.
3) "A Use of Double Integration in Sigma Delta Modulation", J. C. Candy, IEEE TRANSACTIONS ON COMMUNICATIONS, Vol. COM-33, No. 3, pp. 249-258, March, 1985.
4) "Bandpass Sigma-Delta Modulation", R. Schreier, et al., ELECTRONICS LETTERS, Vol. 25, No. 23, pp. 1560-1561, Nov. 9, 1989.

Substantial effort has been made by specialists in the field of oversampled converter design to develop plural-order sigma-delta modulators, so as to obtain higher resolution for a given oversampling ratio, R. Two approaches to designing higher-order sigma-delta modulators are known.

One approach to designing an $N^{th}$-order sigma-delta modulator, where N is an integer greater than one, is to modify the loop of a first-order sigma-delta modulator so as include after the analog integrator at least one further analog integrator in a cascade connection of N analog integrators preceeding the digital-to-analog converter. Each further analog integrator is connected for generating an integrated response to the difference between the analog feedback signal and the integrated response of the one of said analog integrators preceding it in the cascade connection.

Such sampled-data sigma-delta converters filter the quantization noise spectrum with a system function $H(z)$ that is simply differentiation by discrete time—i.e., $H(z) = (1-z^{-1})^N$. Customarily, sigma-delta converters provide what is referred to as "sinusoidal" shaping of quantization noise, wherein the quantization noise previous to shaping through multiplication by $H(z)$ is assumed to be white—i.e., to exhibit a broad-band flat response. This allows the output noise spectrum to be approximated by $$S_N(\omega T) = K_{QN}[2 \sin(\omega T/2)]^{2N} \quad (1)$$

where $K_{QN}$ is the power-spectral-density (PSD) of the unshaped quantization noise. The final noise, accompanying the response of the decimation filtering which follows the sigma-delta modulator, is determined by integrating $S_N(\omega T)$ over the baseband—i.e., from $\omega = 0$ to $\omega = \pi/R$. Using this noise level, the theoretically attainable resolution, B, of a sigma-delta converter with the customary sinusoidal noise shaping can be expressed in terms of bits as follows:

$$\begin{aligned} B = &(L+0.5) \\ &\log_2 R - \log_2[\pi^N(2N+1)^{-0.5}] + \log_2(2^P - 1). \end{aligned} \quad (2)$$

Resolution as so expressed increases by one bit per octave of oversampling for each integer increment in modulator order N.

The number of bits resolution obtained, B, to good approximation is linearly related to P, the number of quantizer bits used in the sigma-delta modulator. It is desirable, then, to be able to use multiple-bit quantization in the sigma-delta modulator, in order to increase overall resolution in the oversampling converter. However, the accuracy of the digital-to-analog converter (DAC) in the quantizer must be consistent with the linearity required of the oversampled ADC after decimation, or else resolution is limited to less than that theoretically attainable. In high-resolution ADCs, this can be a formidable limitation. For example, a 16-bit sigma-delta ADC using a 4-bit quantizer requires 16-bit accuracy from the DAC within the quantizer. Obtaining such accuracy from a DAC is difficult, even with trimming, so it is desirable to avoid this costly requirement.

To avoid the problems of nonlinearity in the DACs, the common practice is to use single-bit DACs after single-bit quantizers, or ADCs, in sigma-delta modulators. In such configurations errors in the two levels of DAC output can introduce gain errors or offset errors, or both. However, the linearity of the converter is never compromised, since a straight line invariably will fit through just two points.

Another approach to designing an $N^{th}$-order sigma-delta modulator, described by R. Schreier, et al. in their paper "Bandpass Sigma-Delta Modulation", uses a second-order resonator or cascade of them in a single feedback loop. Each resonator consists of two cascaded integrators with feedback applied from output to input, which increases the order of the sigma-delta modulator by two. In a variant from this basic scheme for realizing even-order $N^{th}$-order sigma-delta modulators, an additional integrator with feedback applied from output to input may be included with the second-order resonator or cascade of them, thereby to obtain an odd-order $N^{th}$-order sigma-delta modulator.

My allowed U.S. patent application Ser. No. 608,076 filed Nov. 1, 1990, entitled "PLURAL-ORDER SIGMA-DELTA ANALOG-TO-DIGITAL CONVERTERS USING BOTH SINGLE-BIT AND MULTIPLE-BIT QUANTIZERS" and assigned to General Electric Company is incorporated herein by reference. U.S. patent application Ser. No. 608,076 describes a first-order sigma-delta modulator that has a single feedback loop including a linear network and a quantizer, which quantizer comprises a plural-bit (P-bit) ADC, a digital comparator and a single-bit DAC. The linear network comprises a subtractor, for differentially combining an analog feedback signal with an analog input signal to generate an error signal, and an integrator, for integrating the error signal to supply input signal to the quantizer. The loop behaves much the same as a conventional single-feedback-loop, one-bit sigma-delta modulator, insasfar as the feedback signal is concerned; but the P-bit output is available, so the truncation error can be determined. The truncation error is cancelled from the final output signal of this first-order sigma-delta modulator using a modicum of further digital circuitry.

SUMMARY OF THE INVENTION

A high-order sigma-delta modulator has a single feedback loop including a linear network and a quantizer, which quantizer comprises a plural-bit (P-bit) ADC, a digital comparator and a single-bit DAC. The linear network comprises a cascade of integrators, a second-order resonator, a cascade of second-order resonators or a cascade of second-order resonators with an additional integrator. The loop behaves much the same as a conventional single-feedback-loop, one-bit sigma-delta modulator, inasfar as the feedback signal is concerned; but a P-bit preliminary output signal is available from which the truncation error can be determined. The trucation error is cancelled in the ultimate output signal from the high-order sigma-delta modulator, using additional digital circuitry having a transfer function analogous to the overall transfer function for input signal of the cascade connection of the linear network, the P-bit ADC, and any scaling circuitry therein or thereafter.

DETAILED DESCRIPTION

Figure 1:
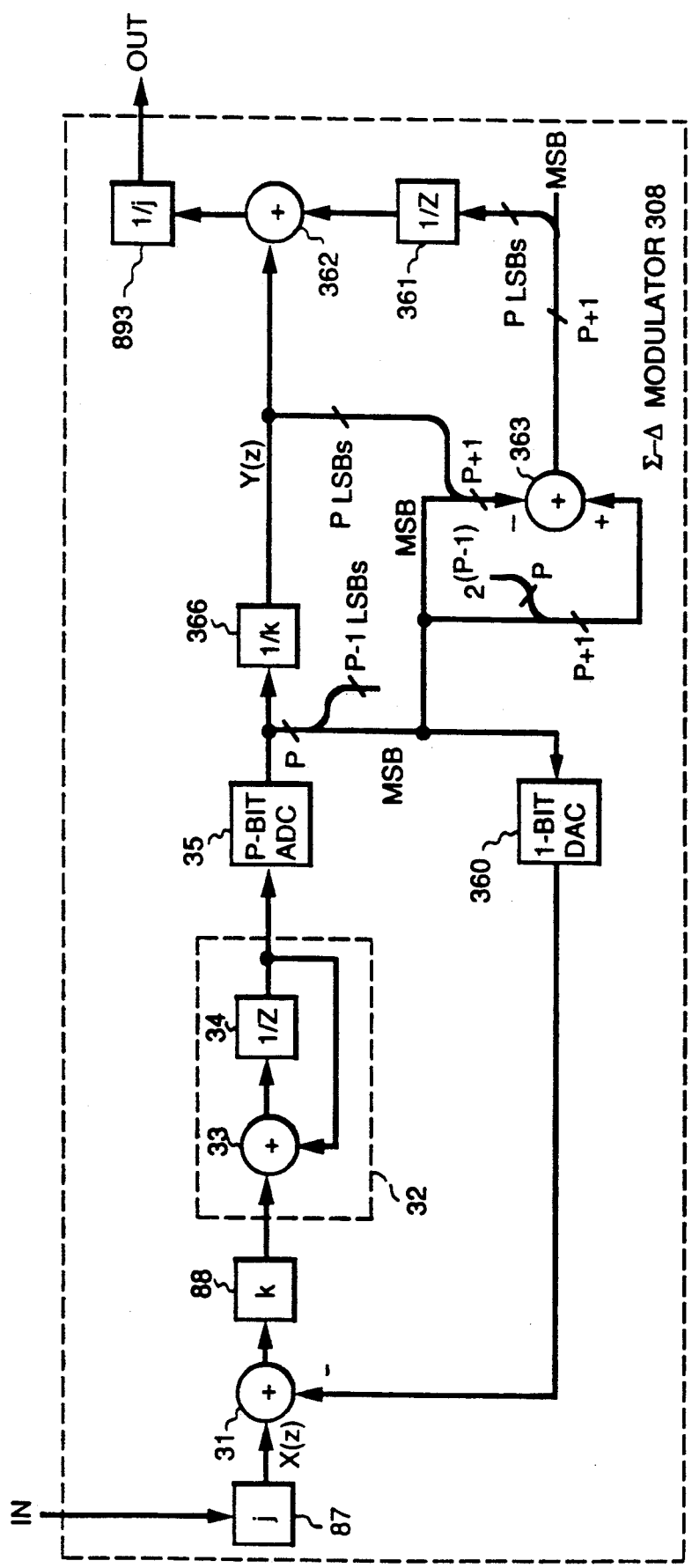
FIG. 1 is a schematic diagram of a first-order single-loop sigma-delta modulator, as shown in FIG. 18 of the drawing in U.S. patent application Ser. No. 608,076 filed Nov. 1, 1990 and entitled "PLURAL-ORDER SIGMA-DELTA ANALOG-TO-DIGITAL CONVERTERS USING BOTH SINGLE-BIT AND MULTIPLE-BIT QUANTIZERS".

FIG. 1 shows a first-order single-loop sigma-delta modulator 308 as shown and described in U.S. patent application Ser. No. 608,076 filed Nov. 1, 1990. The sigma-delta modulator 308 includes an analog subtractor 31. An analog sampled-data input voltage is supplied to an element 87 for scaling, to be multiplied by a factor j to form a minuend input signal for the subtractor 31 having the values x(nT) and X(z) in the time domain and in the z-transform domain respectively. The factor j is usually chosen to be less than one, to reduce the likelihood of over-ranging succeeding circuit elements. The element 87, which can be a potential divider, is usually replaced by a direct connection where the factor j is to be one. Substractor 31 is supplied an analog feedback signal voltage as subtrahend input signal. The resulting difference output signal from subtractor 31 is an error signal voltage, e(nT) in the time domain and E(z) in the z-transform domain, which is scaled by a factor k in an element 88, then integrated respective to time in an integrator 32 to generate a first integrator output voltage. The element 88, which can be a potential divider, is usually replaced by a direct connection where the factor k is to be one. In FIG. 1 the integrator 32 comprises an analog adder 33 and a one-cycle delay element 34. The integrator 32 output voltage is digitized in an analog-to-digital converter 35. Where the element 88 scales down the signal integrated by the integrator 32 and digitized by the ADC 35, an element 366 (such as a digital multiplier or place-shifter) is used to scale up the digital output signal from the converter 35 by a factor 1/k, thereby to generate in the z-transform domain an uncorrected digital output voltage for the sigma-delta modulator stage 308. The values of that uncorrected digital output signal are y(nT) in the time domain and Y(z) in the z-transform domain. Where the element 88 is replaced by a direct connection, so k is one, the element 366 is also replaced by a direct connection, since 1/k is also one. As in a prior-art sigma-delta modulator described in U.S. patent application Ser. No. 608,076 filed Nov. 1, 1990, the analog-to-digital converter 35 generates the uncorrected digital output voltage with P-bit quantizer resolution. A digital-to-analog converter 360 converts the uncorrected digital output voltage Y(z) to analog form, to generate the first analog feedback signal voltage, supplied to subtractor 31 as subtrahend input signal for completing a first feedback loop.

The sigma-delta modulator 308 differs from the prior-art sigma-delta modulator with P-bit quantizer resolution in that the digital-to-analog converter 360 with single-bit resolution converts to analog signal only the most significant bit of the P-bit-wide digital output signal, rather than all P bits of the P-bit-wide digital output signal. The use of the DAC 360 with single-bit resolution assures linearity of the digital-to-analog conversion, but introduces a further error D(z) in the Y(z) uncorrected digital output signal supplied from the sigma-delta modulator 308 in response to an X(z) input signal supplied thereto. This further error, E(z) is in addition to the quantizing error appearing in the prior-art sigma-delta modulator with P-bit quantizer resolution and is introduced owing to the (P−1) less significant bits of Y(z) not being included in the digital signal converted to analog feedback signal. The following equation for the sigma-delta modulator 308 response in the z-transform domain obtains.

$$Y(z) = z^{-1}X(z) + (1-z^{-1})E(z) - z^{-1}D(z) \qquad (3)$$

D(z) is determined by subtracting Y(z) from the analog feedback signal as recoded to digital format. That is, where the most significant bit of Y(z) is a ONE, $$D(z) = 2^{(P-1)} - Y(z) \qquad (4)$$

And where the most significant bit of Y(z) is a ZERO, $$D(z) = -2^{(P-1)} - Y(z). \qquad (5)$$

D(z) is delayed in a one-sample delay element 361 and is added to Y(z) in a digital adder 362 to generate a corrected output signal voltage R(z) that provides the same R(z)/X(z) transfer function for the sigma-delta modulator 308 as for a sigma-delta modulator in which a digital-to-analog converter with P-bit resolution is used instead of the single-bit-resolution DAC 360. The only error in R(z) is caused by the quantization error in the P-bit quantizer 35 and that error can be made suitably small by choosing P to be suitably large.

The subtraction procedure to determine D(z) is shown in FIG. 1 as taking place in a subtractor 363. The subtractor 363 has (P+1) bits in its minuend signal so +2 exp (P−1) as well as −2 exp (P−1) can be coded therein responsive to the most significant bit of Y(z) being a ZERO or being a ONE, respectively. To supply a subtrahend signal for the subtractor 363, Y(z) has its sign bit extended one place by placing the most significant bit of Y(z) before the P bits of Y(z) as supplied from the ADC 35. Since the most significant bit of the D(z) sum output signal from the subtractor 363 will invariably be only a sign bit extension, the most significant bit of the D(z) sum output signal from the subtractor 363 is discarded before applying D(z) to the one-sample delay element 361. One skilled in the art of digital design will appreciate there are several variants possible of the digital circuitry encompassed by the circuit elements 361-363. Where the element 87 has been used to scale the analog sampled-data input voltage by a factor j prior its digitization, the corrected output signal voltage R(z) supplied from the digital adder 362 as its sum output signal is scaled by a compensating 1/j scaling factor by an element 893, such as a digital multiplier or placeshifter. Where the element 87 is replaced by a direct connection, so j is one, the element 893 is also replaced by a direct connection, since 1/j is also one.

Figure 2:
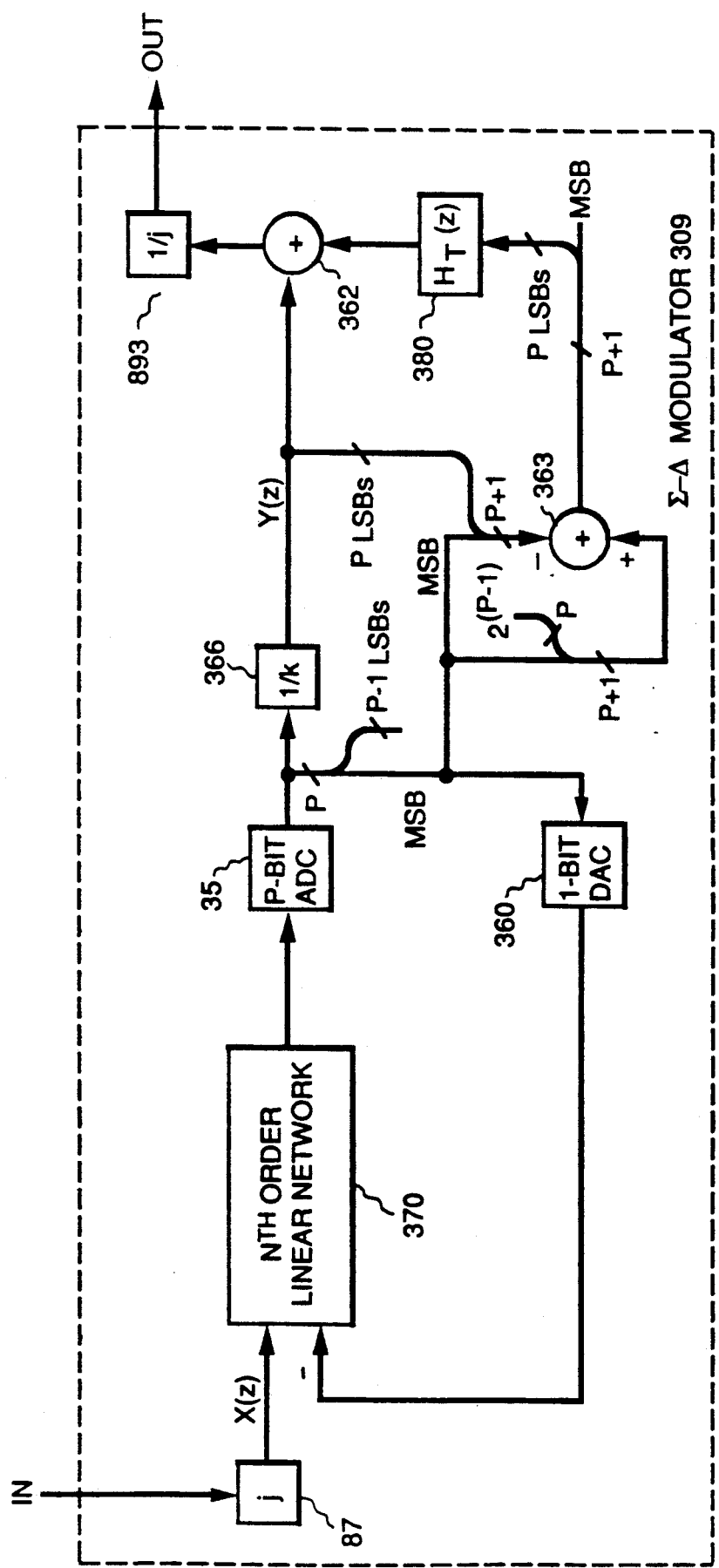
FIG. 2 is a general schematic diagram of a high-order single-loop sigma-delta modulator embodying the invention.

FIG. 2 shows a high-order sigma-delta modulator 309 constructed in accordance with the invention, which includes in a single feedback loop a linear network 370 and a quantizer consisting of a plural-bit (P-bit) ADC 35, a digital comparator (shown as a simple most significant bit stripping of a two's complement number) and a single-bit DAC 360. The k gain factor is attributed to the linear network 370, rather than to the element 88. The FIG. 2 loop behaves essentially the same as a conventional single-loop, one-bit-resolution modulator, as far as the feedback signal is concerned, but the P-bit output is available and the truncation error is determined and cancelled in a simple manner using some additional digital circuitry. The FIG. 2 sigma-delta modulator is related to prior-art high-order sigma-delta modulators in a way analogous to the way the FIG. 1 first-order sigma-delta modulator is related to prior-art first-order sigma-delta modulators. The FIG. 2 loop includes the $N^{th}$-order linear network 370 instead of the subtractor 31 and integrator 32 of FIG. 1, where N is an integer greater than one. In FIG. 2 an $N^{th}$-order digital network 380 with transfer function $H_{D(z)}$ replaces the one-sample delay element 361 in the digital circuitry used to cancel the truncation error, D(z). The transfer function $H_{D(z)}$ of the digital network 380 matches that of truncation error in the Y(z) output. This transfer function depends on the linear network 370 and is determined from the analysis of the linearized model of the modulator, shown in FIG. 3.

Figure 3:
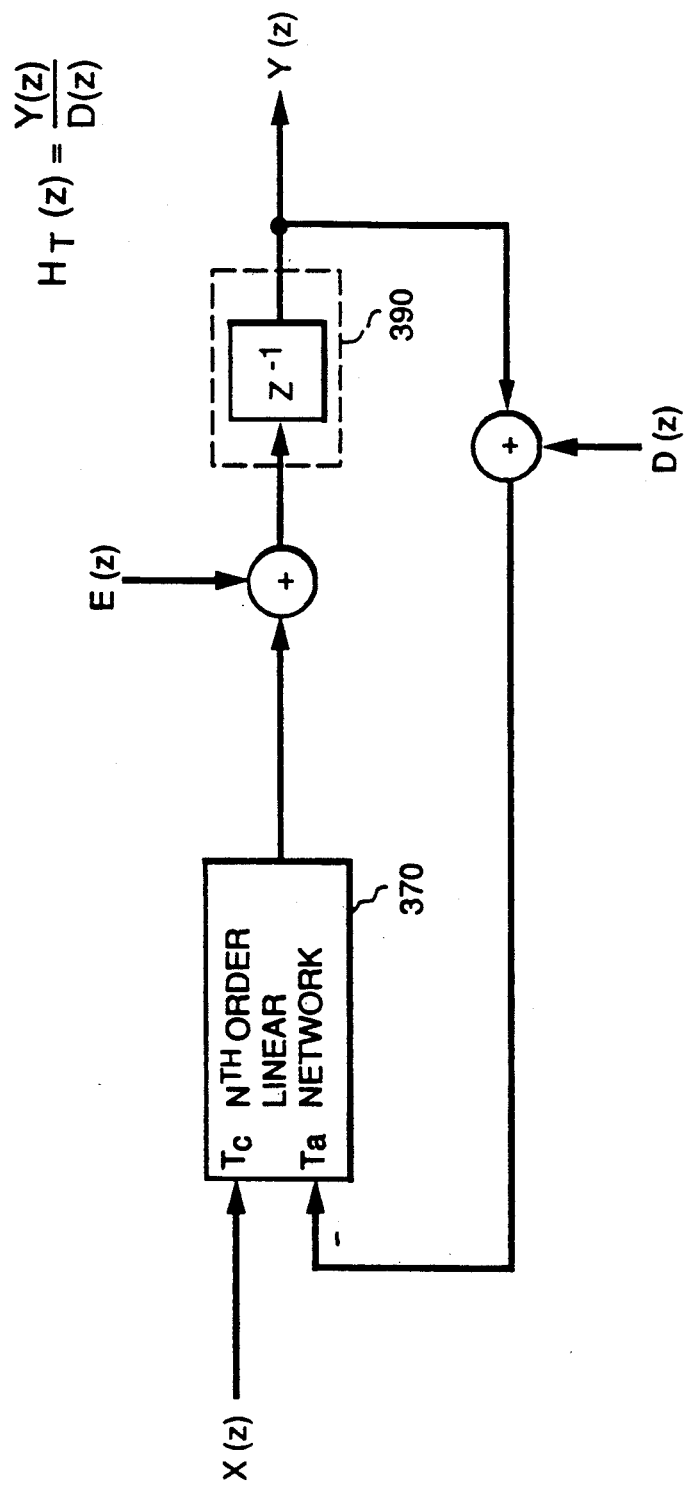
FIG. 3 is a schematic diagram of a linearized model of the FIG. 2 modulator useful in analysis of the operation of the FIG. 2 modulator.

The FIG. 3 linear modulator model has an optional $z^{-1}$ delay element 390 in its forward path to allow loop settling for linear networks containing a delay-free path. Networks that have at least one sample period of delay do not require this additional loop delay element. The linear network 370 is an active switched-capacitor or active RC circuit containing a cascade of integrators or resonators as shown by way of respective example in any one of the FIGS. 4-6. FIG. 3 shows the linear network 370 having two signal inputs: A(z) and C(z). The networks shown in FIGS. 4 and 5 require the additional delay element 390 whereas the network shown in FIG. 6 does not. The transfer functions for these two inputs A(z) and C(z) have the same natural modes and are designated $T_a$ and $T_c$ respectively. Specifically, $T_a$ and $T_c$ each can be written as a ratio of numerator and denominator polynomials in z as follows:

$$T_a(z) = \frac{n_a(z)}{d(z)} \quad T_c(z) = \frac{n_c(z)}{d(z)} \qquad (6), (7)$$

Using these transfer functions and solving for the output response of the linearized model results in $$Y(z) = X(z)\left[\frac{n_c(z)}{d(z) + n_a(z)}\right] + \qquad (8)$$

$$E(z)\left[\frac{d_z}{d(z) + n_a(z)}\right] - D(z)\left[\frac{n_a(z)}{d(z) + n_a(z)}\right]$$

for the modulator without the additional delay, and $$Y(z) = x(z)\left[\frac{z^{-1}n_c(z)}{d(z) + z^{-1}n_a(z)}\right] + \qquad (9)$$

$$E(z)\left[\frac{z^{-1}d(z)}{d(z) + z^{-1}n_a(z)}\right] - D(z)\left[\frac{z^{-1}n_a(z)}{d(z) + z^{-1}n_a(z)}\right]$$

with the extra delay in the loop, where X(z) is the input, Y(z) is the output, E(z) is the quantization error and D(z) is truncation error. The transfer function relating the truncation error to the output can be taken directly from the applicable equation above. That is, for no additional delay element 390:

$$H_T = \frac{Y(z)}{D(z)} = \frac{n_a(z)}{d(z) + n_a(z)}. \qquad (10)$$

And, for an additional delay element 390:

$$H_T = \frac{Y(z)}{D(z)} = \frac{z^{-1}n_a(z)}{d(z) + z^{-1}n_a(z)} \qquad (11)$$

As stated previously, the digital network 380 must duplicate $H_T(z)$ in order to cancel the truncation error by subtraction.

The modulator of FIG. 2 also includes a digital multiplier 366 to multiply the output of the P-bit ADC 35 by a constant G, to correct for scaling that may be incorporated in the modulator loop. Often, in a loop with a one-bit quantizer, scaling is used to constrain the internal signals from clipping. In particular, the signal at the input to the ADC 35 must be scaled to be within its input voltage range. With one-bit feedback, arbitrary loop scaling of k can be introduced by an analog scaling element 88 as shown in FIG. 1 or by the linear network 370 as shown in FIG. 2. However, such analog scaling alters the transfer function $H_T(z)$ of the truncation error from its unscaled value. To cancel the noise, either the transfer function of $H_T(z)$ with scaling should be used or the ADC 35 output signal can be multiplied by 1/k to compensate for the scaling and the unscaled truncation error transfer function is used. Generally, a simpler transfer function results if the latter approach, which is shown in FIG. 2, is used.

Figure 4:
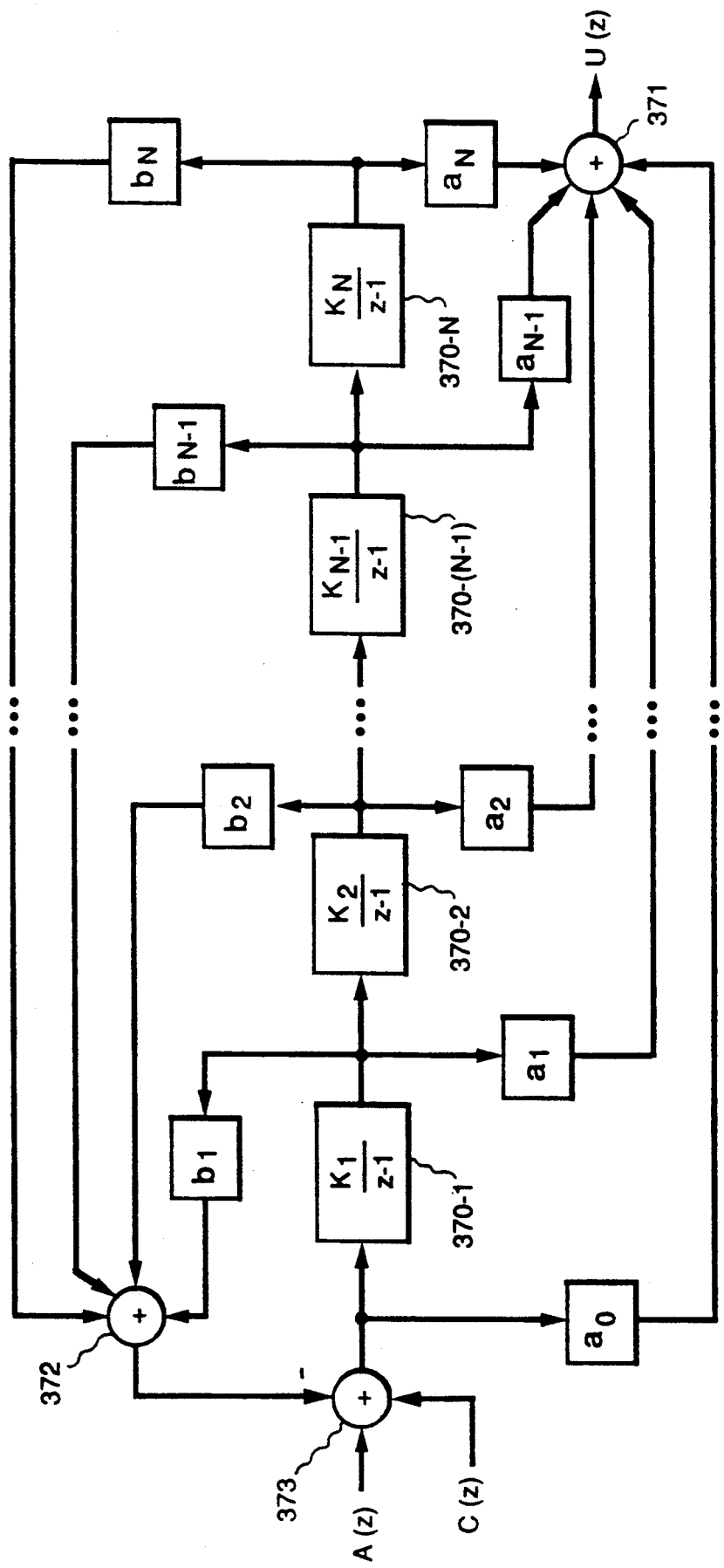
FIGS. 4–6 are schematic diagrams of various forms the $N^{th}$-order linear network may take in different species of the FIG. 2 sigma-delta modulator.
Figure 5:
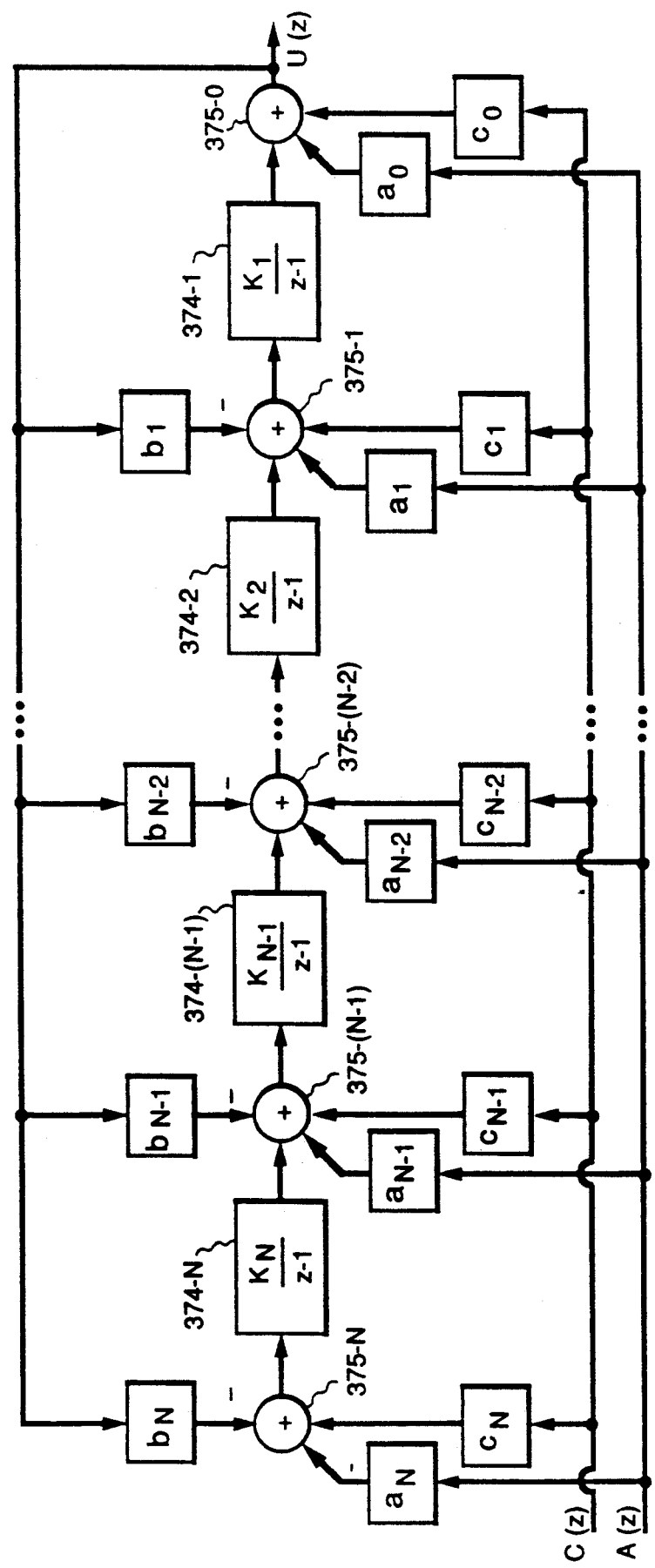
Figure 6:
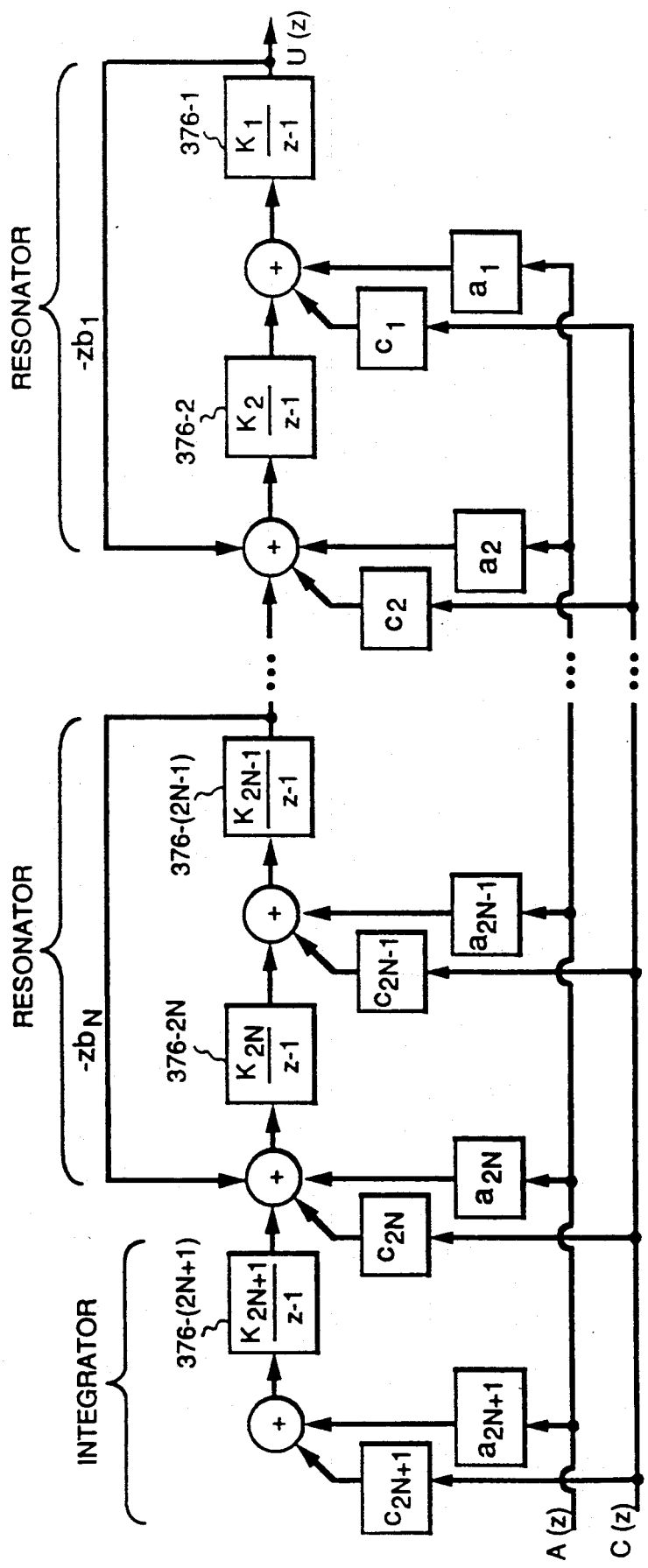

Several possibilities exist for the linear network 370 used in the modulator. Three representative networks are shown in FIGS. 4-6. However, other networks can be conceived, and are within the scope of applicability of this invention.

FIG. 4 shows a cascade connection of integrators 370-1, ... 370-N arranged in an output-weighted analog filter configuration suitable for the linear network 370, with the output signal U(z) generated in weighted analog addition circuitry 371 as a weighted sum of all the input signals and the intermediate integrator output signals. The weighted analog addition circuitry 371 is shown as comprising an analog adder having blocks in its input connections indicative of the $a_0, a_1, a_2, \ldots a_{N-1}, a_N$ weighting factors applied to the summands applied to those input connections in the weighted analog addition. The output signal U(z) is used as an input signal for the ADC 35 in the FIG. 2 sigma-delta modulator when the linear network 370 is the FIG. 4 analog filter configuration. To implement finite-frequency complex pole pairs, a weighted sum of intermediate integrator output signals is generated in weighted analog addition circuitry 372. The weighted analog addition circuitry 372 is shown as comprising an analog adder having blocks in its input connections indicative of the $b_1, b_2, \ldots b_{N-1}, b_N$ weighting factors applied to the summands applied to those input connections in the weighted analog addition. The weighted sum of the intermediate integrator output signals generated in weighted analog addition circuitry 372 is fed back to a plural-input analog adder/subtractor 373 to be subtracted from A(z) together with C(z). The output signal from the analog adder/subtractor 373 is applied as the input signal to the integrator 370-1.

FIG. 5 shows integrators 374-1, ... 374-N arranged together with respectively preceding analog weighted summation circuits 375-1, ... 375-N in an input-weighted analog filter configuration suitable for the linear network 370, with inputs A(z) and C(z) applied as weighted feed-ins to the inputs of each of the integrators 370-1, ... 370-N. The output signal U(z) from an analog summation circuit 375-0 is used as an input signal for the ADC 35 in the FIG. 2 sigma-delta modulator when the linear network 370 is the FIG. 5 analog filter configuration. Finite-frequency complex poles in the FIG. 5 analog filter configuration are implemented by multiple weighted feedback of the output signal U(z) to the inputs of each of the integrators 374-1, ... 374-N via their respective preceding analog weighted summation circuits 375-1, ... 375-N. The FIG. 5 analog filter configuration provides a linear network 370 that permits different numerator polynomials to be implemented in the signal transfer function and in the noise transfer function.

FIG. 6 shows a cascade of second-order resonators suitable for the linear network 370 formed from pairs of integrators 376-1, 376-2, ... 376-(2N−1), 376-2N. A single additional integrator 376-(2N+1) is needed if an odd-order network is being implemented. Otherwise, for even-order networks, only resonators are used. Input signals A(z) and C(z) are applied as weighted feed-ins to the inputs of each integrator. As in the case of the FIG. 5 analog filter configuration, different numerator polynomials can be used for the signal and noise transfer functions with the FIG. 6 analog filter configuration.

For completeness, the actual transfer functions for modulators using the first two types of networks are included here. Despite the topological differences, these two networks have similar transfer functions with the coefficients numbered in the order shown on the figures. In fact, the same equations for the second network apply to the first by taking coefficient $c_N = a_N$ and all other $c_i$ coefficients as zero. The signal transfer function $H_X(z)$, noise transfer function $H_E(z)$ and truncation noise transfer function $H_T(z)$ are described by $$H_X(z) = \frac{Y(z)}{X(z)} = \left[ \sum_{i=0}^{N} c_i(z-1)^{(N-i)} \prod_{j=1}^{i} k_j \right] / D(z) \quad (12)$$

$$H_E(z) = \frac{Y(z)}{X(z)} = \left[ (z-1)^N + \sum_{i=0}^{N} b_i(z-1)^{(N-i)} \prod_{j=1}^{i} k_j \right] / D(z) \quad (13)$$

$$H_T(z) = \frac{Y(z)}{X(z)} = -\left[ \sum_{i=0}^{N} a_i(z-1)^{(N-i)} \prod_{j=1}^{i} k_j \right] / D(z) \quad (14)$$

where $$D(z) = z(z-1)^N + \sum_{i=0}^{N} b_i(z-1)^{(N-i)} \prod_{j=1}^{i} k_j + \sum_{i=0}^{N} a_i(z-1)^{(N-i)} \prod_{j=1}^{i} k_j \quad (15)$$

The design procedure for a modulator involves approximating the desired quantization noise spectrum by a z-domain transfer function, and realizing this transfer function by expanding the $H_X(z)$ equation above and matching its coefficients to those of the desired transfer function to produce a set of design equations. After this, a similar procedure is used to approximate and realize the transfer function for the signal $H_X(z)$, again matching terms in the transfer functions to produce additional design equations. These design equations can then be solved to yield the component values for the modulator. Note that there are no restrictions on the nature of the noise transfer functions that can be handled with this invention. It can be applied to conventional (low-pass) sigma-delta modulators and to bandpass sigma-delta modulators (also called resonant oversampling).

The transfer functions for the cascaded resonator network of FIG. 6 are tedious to derive in general form for an $N^{th}$ order network. However, they can be readily derived for a specific-order network and hence the truncation error cancellation can also be implemented for this specific-order network.

Figure 7:
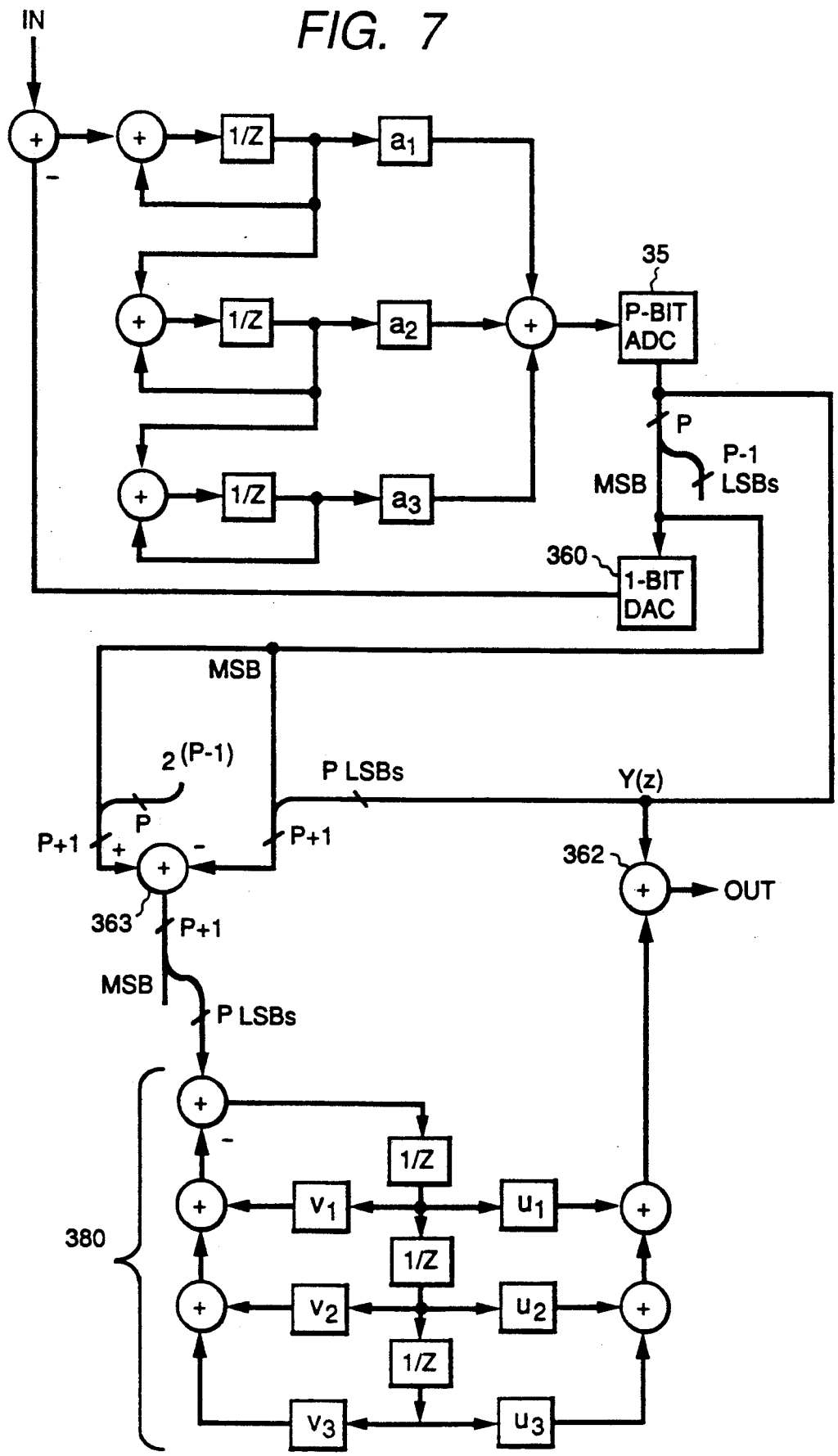
FIG. 7 is a schematic diagram of a third-order single-loop sigma-delta modulator emboying the invention, showing the particular circuitry for cancelling truncation error in the ultimate output signal from that sigma-delta modulator.

The third-order single loop modulator incorporating the truncation error cancellation shown in FIG. 7 has been computer simulated to validate the invention. It makes use of the cascade of integrators linear network of FIG. 4, however, the $b_i$ feedback coefficients are not needed, since complex conjugate poles are not used in the transfer function. Also, the $a_0$ coefficient is not used, so that the network has a minimum delay of one sample. As such, the optional additional loop delay shown in FIG. 3 is unnecessary. The digital network that incorporates the $H_T(z)$ transfer function is implemented in direct form in FIG. 7. However, numerous other implementations are possible, including using a digital version of the analog modulator without the quantizer. The values of the weighting coefficients $a_1$, $a_2$, $a_3$, $u_1$, $u_2$, $u_3$, $v_1$, $v_2$ and $v_3$ are tabulated below.

$$a_1 = 0.860183 \quad a_2 = 0.332791 \quad a_3 = 0.0550481$$
$$u_1 = 0.860183 \quad u_2 = -1.387575 \quad u_3 = 0.5824401$$
$$v_1 = -2.139817 \quad v_2 = 1.612425 \quad v_3 = -0.417559$$

Computer simulation comparing the FIG. 7 modulator using a 4-bit ADC and one-bit DAC to a one-bit quantization version, for an oversampling ratio of 64, showed an average increase in signal-to-noise ratio (S/N) of about 17.5 dB or 2.9 bits for the FIG. 7 modulator, which increase was substantially constant over the entire input level range up to $-6$ dB. At higher input levels this advantage diminishes. This 2.90 bit improvement in resolution across most of the input level range is very close to the difference in ADC resolution of 3 bits and is achieved despite just a one-bit DAC in the feedback loop. Other computer simulations have shown that the FIG. 7 modulator is quite tolerant of typical circuit nonidealities that include component mismatch, finite op amp gain, and ADC nonlinearity. Furthermore, computer simulations have shown that ADC nonlinearity does not degrade overall modulator nonlinearity, which advantage is attributed to a one-bit DAC being used to generate the analog feedback signal for the modulator.

What is claimed is:

1. A sigma-delta modulator of $N^{th}$ order, N being a positive number greater than one so $N^{th}$ order is higher than first-order, said sigma-delta modulator comprising:
    means for supplying an analog input signal for said sigma-delta modulator;
    a network for generating an $N^{th}$-order response equal to a transfer function times the difference between said analog input signal and an analog feedback signal;
    an analog-to-digital converter for converting said $N^{th}$-order response to a digitized $N^{th}$-order response with multiple-bit resolution;
    means responsive to digitized $N^{th}$-order response with multiple-bit resolution for supplying a preliminary output signal for said sigma-delta modulator of $N^{th}$ order, said preliminary output signal being related to said digitized $N^{th}$-order response by a scaling factor;
    means for generating said analog feedback signal in response to said digitized $N^{th}$-order response with multiple-bit resolution;
    at least one unit sample delay in the feedback loop thus formed by said network for generating an $N^{th}$-order response, said analog-to-digital converter and said means for generating said analog feedback signal;
    a digital-to-analog converter being included in said means for generating said analog feedback signal, said digital-to-analog converter connected for converting only the most significant bit of the digitized $N^{th}$-order response, thereby to generate said analog feedback signal; and
    means for reducing error in the preliminary output signal for said sigma-delta modulator of $N^{th}$ order arising from said digital-to-analog converter converting only the most significant bit of the digitized $N^{th}$-order response, said means for reducing error comprising:
    means for obtaining a digital representation of said analog feedback signal,
    means for generating a correction signal equal to said transfer function times said scaling factor times a differential response to the digitized $N^{th}$-order response and the digital representation of said analog feedback signal, and
    means for combining the correction signal and the preliminary output signal to generate an output signal in which there is a reduction in said error arising from said digital-to-analog converter converting only the most significant bit of the digitized $N^{th}$-order response to generate said analog feedback signal.

2. A sigma-delta modulator as set forth in claim 1 wherein said means for combining the correction signal and the preliminary output signal to generate an output signal is a digital adder.

3. A sigma-delta modulator as set forth in claim 2 wherein said means for generating a correction signal comprises:
    a digital subtractor receiving the digitized $N^{th}$-order response with sign bit extension as a subtrahend input signal, receiving a minuend input signal having a most significant bit corresponding to the most significant bit of the digitized $N^{th}$-order response and having P less significant bits coding $2^{(P-1)}$, and supplying a digital difference output signal; and
    means for multiplying the output signal of said digital subtractor by said transfer function and by said scaling factor to generate said correction signal.

4. A sigma-delta modulator as set forth in claim 3 wherein said digitized $N^{th}$-order response with multiple-bit resolution is said preliminary output signal and said scaling factor is therefore one.

5. A sigma-delta modulator as set forth in claim 3 wherein said digitized $N^{th}$-order response with multiple-bit resolution is multiplied by said scaling factor of a value other than one, thereby to form said preliminary output signal.

6. A sigma-delta modulator as set forth in claim 1 wherein said digitized $N^{th}$-order response with multiple-bit resolution is said preliminary output signal and said scaling factor is therefore one.

7. A sigma-delta modulator as set forth in claim 1 wherein said digitized $N^{th}$-order response with multiple-bit resolution is multiplied by said scaling factor of a value other than one, thereby to form said preliminary output signal.

8. In a sigma-delta modulator of $N^{th}$ order, N being a positive number greater than one so $N^{th}$ order is higher than first-order, said sigma-delta modulator comprising:
    means for supplying an analog input signal for said sigma-delta modulator;
    a network for generating an $N^{th}$-order response equal to a first transfer function times said analog input signal minus a second transfer function times an analog feedback signal;
    an analog-to-digital converter for converting said $N^{th}$-order response to a digitized $N^{th}$-order response with multiple-bit resolution;
    means responsive to digitized $N^{th}$-order response with multiple-bit resolution for supplying a preliminary output signal for said sigma-delta modulator of $N^{th}$-order;

means for generating said analog feedback signal in response to said digitized $N^{th}$-order response with multiple-bit resolution;

at least one unit sample delay in the feedback loop thus formed by said network for generating an $N^{th}$-order response, said analog-to-digital converter and said means for generating said analog feedback signal;

a digital-to-analog converter being included in said means for generating said analog feedback signal, said digital-to-analog converter connected for converting only the most significant bit of the digitized $N^{th}$-order response, thereby to generate said analog feedback signal; and means for reducing error in the preliminary output signal for said sigma-delta modulator of $N^{th}$ order arising from said digital-to-analog converter converting only the most significant bit of the digitized $N^{th}$-order response, said means for reducing error comprising:

means for obtaining a digital representation of said analog feedback signal, means for generating a correction signal equal to the difference of the digitized $N^{th}$-order response as multiplied by said first transfer function and the digital representation of said analog feedback signal as multiplied by said second transfer function and by said scaling factor, and means for combining the correction signal and the preliminary output signal to generate an output signal in which there is a reduction in said error arising from said digital-to-analog converter converting only the most significant bit of the digitized $N^{th}$-order response to generate said analog feedback signal.

9. A sigma-delta modulator as set forth in claim 8 wherein said means for combining the correction signal and the preliminary output signal to generate an output signal is a digital adder.

10. A sigma-delta modulator as set forth in claim 9 wherein said means for generating a correction signal comprises:

a digital subtractor receiving the digitized $N^{th}$-order response with sign bit extension as a subtrahend input signal, receiving a minuend input signal having a most significant bit corresponding to the most significant bit of the digitized integrated response and having P less significant bits coding $2^{(P-1)}$, and supplying a digital difference output signal; and means for multiplying the output signal of said digital subtractor by said second transfer function and by said scaling factor to generate said correction signal.

11. A sigma-delta modulator as set forth in claim 10 wherein said digitized $N^{th}$-order response with multiple-bit resolution is said preliminary output signal and said scaling factor is therefore one.

12. A sigma-delta modulator as set forth in claim 10 wherein said digitized $N^{th}$-order response with multiple-bit resolution is multiplied by said scaling factor of a value other than one, thereby to form said preliminary output signal.

13. A sigma-delta modulator as set forth in claim 8 wherein said digitized $N^{th}$-order response with multiple-bit resolution is said preliminary output signal and said scaling factor is therefore one.

14. A sigma-delta modulator as set forth in claim 8 wherein said digitized $N^{th}$-order response with multiple-bit resolution is multiplied by said scaling factor of a value other than one, thereby to form said preliminary output signal.

* * * * *